United States Patent
Park (10) Patent No.: US 7,379,337 B2
(45) Date of Patent: May 27, 2008

(54) FLASH MEMORY DEVICE AND READ OPERATION METHOD THEREOF

(75) Inventor: Seong Je Park, Kyeongki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 13 days.

(21) Appl. No.: 11/488,836

(22) Filed: Jul. 19, 2006

(65) Prior Publication Data
US 2007/0223281 A1    Sep. 27, 2007

(30) Foreign Application Priority Data
Mar. 27, 2006    (KR) ...................... 10-2006-0027407

(51) Int. Cl.
*G11C 16/04* (2006.01)
(52) U.S. Cl. ..................... 365/185.18; 365/185.17; 365/185.12
(58) Field of Classification Search ........... 365/185.17, 365/185.11, 185.12, 203, 230.04, 230.08
See application file for complete search history.

(56) References Cited

U.S. PATENT DOCUMENTS 6,813,214 B2 * 11/2004 Cho et al. .............. 365/230.04

2006/0274588 A1 * 12/2006 Kang et al. .................. 365/203

FOREIGN PATENT DOCUMENTS

| JP | 10-093054 | 4/1998 |
| KR | 1020020002681 | 1/2002 |
| KR | 1020040006933 | 1/2004 |
| KR | 1020040082637 | 9/2004 |

* cited by examiner

*Primary Examiner*—Gene N. Auduong
(74) *Attorney, Agent, or Firm*—Lowe Hauptman Ham & Berner LLP (57) ABSTRACT

A flash memory device having a function of selectively changing a precharge voltage for a sensing node and a read operation method thereof. The flash memory device includes a memory cell array, a precharge voltage generator, and a plurality of page buffers. The memory cell array includes a plurality of memory cells respectively sharing a plurality of word lines and a plurality of bit lines. The precharge voltage generator outputs one of first and second voltage as a precharge voltage in response to a selection control signal. The plurality of page buffers are connected to every pair of the plurality of bit lines one by one and precharge sensing lines to the precharge voltage in response to a precharge control signal.

18 Claims, 6 Drawing Sheets

FLASH MEMORY DEVICE AND READ OPERATION METHOD THEREOF

BACKGROUND

1. Field of the Invention

The present invention generally relates to semiconductor memory devices, and more particularly, to flash memory devices.

2. Discussion of Related Art

In general, a flash memory device includes a page buffer for programming or reading a large capacity of data for a short period of time. The page buffer includes high-voltage elements and low voltage elements. Accordingly, in the manufacture process of the flash memory device, a part of the page buffer is formed in a high-voltage element region of a semiconductor substrate and the remaining portions are formed in a low voltage element region of the semiconductor substrate.

Figure 1:
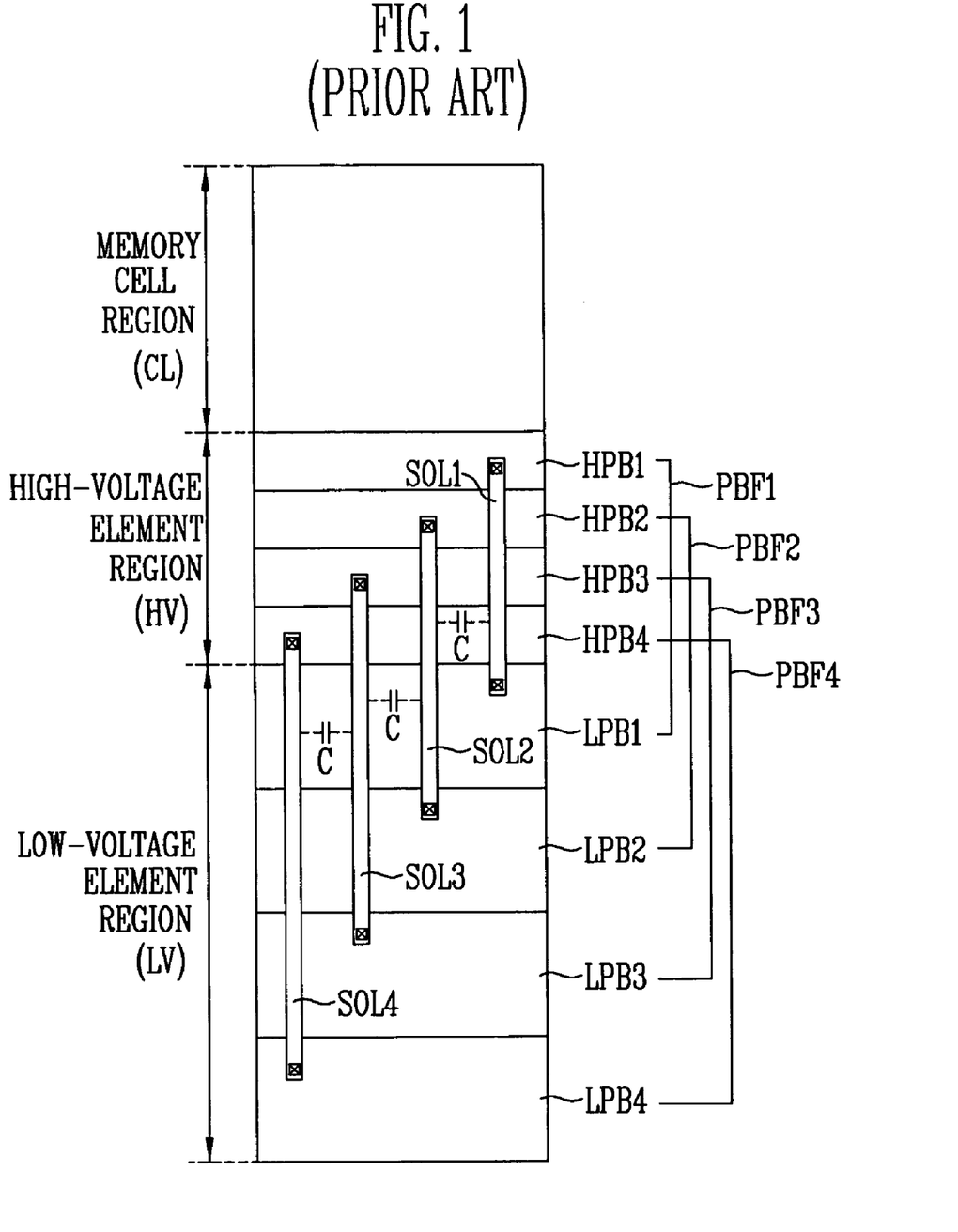
FIG. 1 is a schematic layout diagram of a part of a flash memory device in the related art.

FIG. 1 is a schematic layout diagram of a part of a flash memory device in the related art. FIG. 1 shows a memory cell region CL, a high-voltage element region HV, and a low-voltage element region LV. The memory cell region CL is a region in which memory cells are formed. The high-voltage element region HV and the low-voltage element region LV are regions in which circuits of the flash memory device are formed. For the simplicity of the drawing, only regions corresponding to the page buffers are shown in FIG. 1.

In the high-voltage element region HV, reference numerals "HPB1" to "HPB4" denote regions in which bit line selection circuits of the page buffers are formed (hereinafter, referred to as "bit line selection circuit regions"). Furthermore, in the low-voltage element region LV, reference numerals "LPB1" to "LPB4" denote regions in which register circuits of the page buffers are formed (hereinafter, referred to as "register circuit regions"). As a result, page buffer regions PBF1 to PBF4 having the bit line selection circuit regions HPB1 to HPB4, respectively, and the register circuit regions LPB1 to LPB4, respectively, are disposed on one side of the memory cell region CL. For example, the page buffer region PBF1 may include the bit line selection circuit region HPB1 and the register circuit region LPB1.

Sensing lines SOL1 to SOL4 are further disposed in order to form electrical paths between the bit line selection circuit regions HPB1 to HPB4 and the register circuit regions LPB1 to LPB4, which are disposed in different regions. The sensing lines SOL1 to SOL4 are disposed on the bit line selection circuit regions HPB1 to HPB4 and the register circuit regions LPBL to LPB4, respectively, and also cross the bit line selection circuit regions HPB1 to HPB4 and the register circuit regions LPB1 to LPB4, respectively. Since the page buffer regions PBF1 to PBF4 are arranged adjacent to each other, the sensing lines SOL1 to SOL4 are also arranged adjacent to each other. If the sensing lines SOL1 to SOL4 are disposed adjacent to each other as described above, interference may occur between signals respectively transferred to the sensing lines SOL1 to SOL4 due to parasitic capacitance C existing between the sensing lines SOL1 to SOL4 in the read operation of the flash memory device. This will be described in more detail below.

An example in which read data of "1" (i.e., VCC) are transferred through the sensing line SOL2 and read data of "0" (i.e., VSS) are transferred through the sensing lines SOL1, SOL3 during the read operation may be considered. In this case, a page buffer connected to the sensing line SOL2 may erroneously sense that the read data of the sensing line SOL2 is "0". This is because the sensing line SOL2 must be kept to the voltage (VCC) level although the sensing lines SOL1, SOL3 become the voltage (VSS) level, but a voltage of the sensing line SOL2 is reduced as a result of the coupling capacitance of the parasitic capacitance C.

If the voltage of the sensing line SOL2 is reduced as described above, the page buffer connected to the sensing line SOL2 may erroneously sense that a logic value of read data transferred to the sensing line SOL2 is "0" not "1". As a result, the read data transferred to the sensing lines SOL1 to SOL4, respectively, may be erroneously sensed by the page buffers due to an interference phenomenon between the sensing lines SOL1 to SOL4. Such a phenomenon becomes more profound as semiconductor memory devices are further miniaturized and more highly integrated, causing the distance between the sensing lines to be gradually reduced.

Furthermore, the interference phenomenon between the sensing lines causes failure in the read operation or the normal read operation for program verification of the flash memory device.

SUMMARY OF THE INVENTION

An embodiment of the present invention is that it provides a flash memory device, in which precharge voltages for sensing nodes are selectively changed during a read operation or a normal read operation for program verification, thereby reducing signal interference between the sensing lines and reducing read operation failure accordingly.

Another embodiment of the present invention is that it provides a read operation method of a flash memory device, in which precharge voltages for sensing nodes are selectively changed during a read operation or a normal read operation for program verification, thereby reducing signal interference between the sensing lines and reducing read operation failure accordingly.

According to an aspect of the present invention, there is provided a flash memory device including a memory cell array, a precharge voltage generator, and a plurality of page buffers. The memory cell array includes a plurality of memory cells respectively sharing a plurality of word lines and a plurality of bit lines. The precharge voltage generator outputs one of first and second voltage as a precharge voltage in response to a selection control signal. The plurality of page buffers are connected to every pair of the plurality of bit lines one by one and precharge sensing lines to the precharge voltage in response to a precharge control signal. During a verification read operation or normal read operation of the flash memory device, each of the plurality of page buffers sense read data transferred from one of the plurality of memory cells to one of the sensing lines through the at least one pair of bit lines.

According to another aspect of the present invention, there is provided a read operation method of a flash memory device having a plurality of memory cells, including the steps of generating a precharge voltage that is changed; precharging at least one sensing line to the precharge voltage in response to a precharge control signal; selecting one of a plurality of word lines and supplying the selected word line with a read voltage or a verification read voltage; selecting one of at least one pair of bit lines and connecting the selected bit line to the at least one sensing line, in response to bit line selection signals and discharge signals; and sensing read data, which have been transferred from a memory cell connected to the selected word line and the selected bit line, of the plurality of memory cells, to the at least one sensing line and storing the sensed data in at least one register, in response to a latch control signal.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The present invention will now be described in detail in connection with certain exemplary embodiments with reference to the accompanying drawings.

Figure 2:
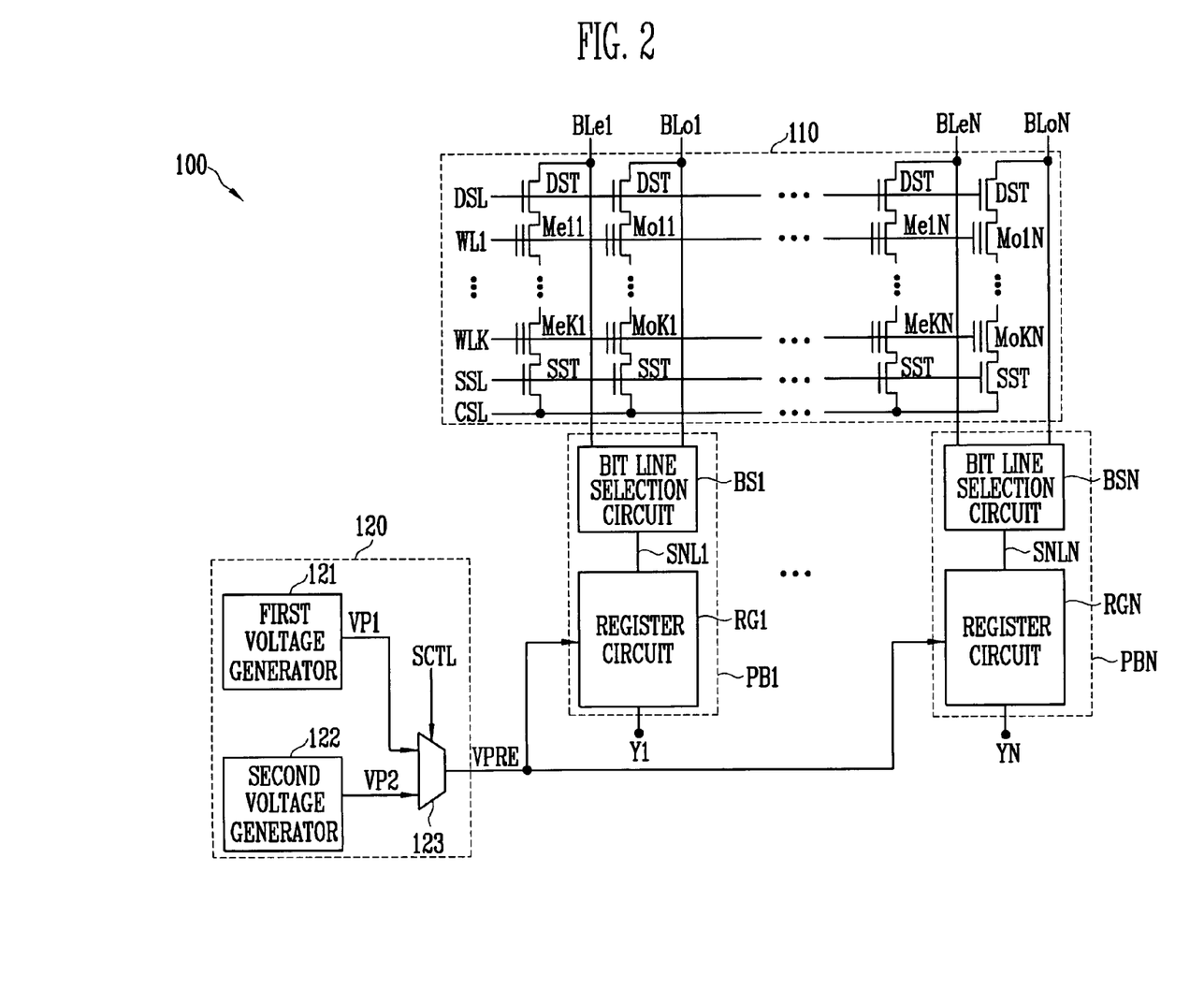
FIG. 2 is a schematic block diagram of a flash memory device according to an embodiment of the present invention.

FIG. 2 is a block diagram of a flash memory device according to an embodiment of the present invention.

Referring to FIG. 2, a flash memory device 100 includes a memory cell array 110, a precharge voltage generator 120, and a plurality of page buffers PB1 to PBN (N is an integer).

The memory cell array 110 includes memory cells Me11 to MeKN, Mo11 to MoKN (K and N are integers), which share bit lines BLe1 to BLeN, BLo1 to BLoN (N is an integer) and word lines WL1 to WLK. In the memory cell array 110, the memory cells Me11 to Me1N, Mo11 to Mo1N connected to the same word line (for example, WL1) form one page PG1. The memory cell array 110 further includes drain select transistors DST connected to a drain select line DSL and source select transistors SST connected to a source select line SSL. The construction and operation of the memory cell array 110 are well known to those having ordinary skill in the art and description thereof will be omitted for simplicity.

The precharge voltage generator 120 includes a first voltage generator 121, a second voltage generator 122, and a voltage selector 123. The first voltage generator 121 generates a first voltage VP1. The second voltage generator 122 generates a second voltage VP2. The second voltage VP2 may be higher than the first voltage VP1. The voltage selector 123 selects one of the first voltage VP1 and the second voltage VP2 and outputs a selected voltage VP1 or VP2 as a precharge voltage VPRE, in response to a selection control signal SCTL. Preferably, when the selection control signal SCTL is enabled, the voltage selector 123 may output the first voltage VP1 as the precharge voltage VPRE. When the selection control signal SCTL is disabled, the voltage selector 123 may output the second voltage VP2 as the precharge voltage VPRE. The voltage selector 123 may be implemented using a multiplexer.

The plurality of page buffers PB1 to PBN includes bit line selection circuits BS1 to BSN and register circuits RG1 to RGN, respectively. For example, the page buffer PB1 may include the bit line selection circuit BS1 and the register circuit RG1. The bit line selection circuits BS1 to BSN are connected to the register circuits RG1 to RGN through sensing lines SNL1 to SNLN (N is an integer). For example, the bit line selection circuit BS1 may be connected to the register circuit RG1 through the sensing line SLN1. Each of the plurality of page buffers PB1 to PBN is connected to at least one pair of bit lines. For example, the page buffer PB1 may be connected to the bit lines BLe1, BLo1. Each of the page buffers PB1 to PBN may be designed according to a dual latch type or a single latch type.

Figure 3:
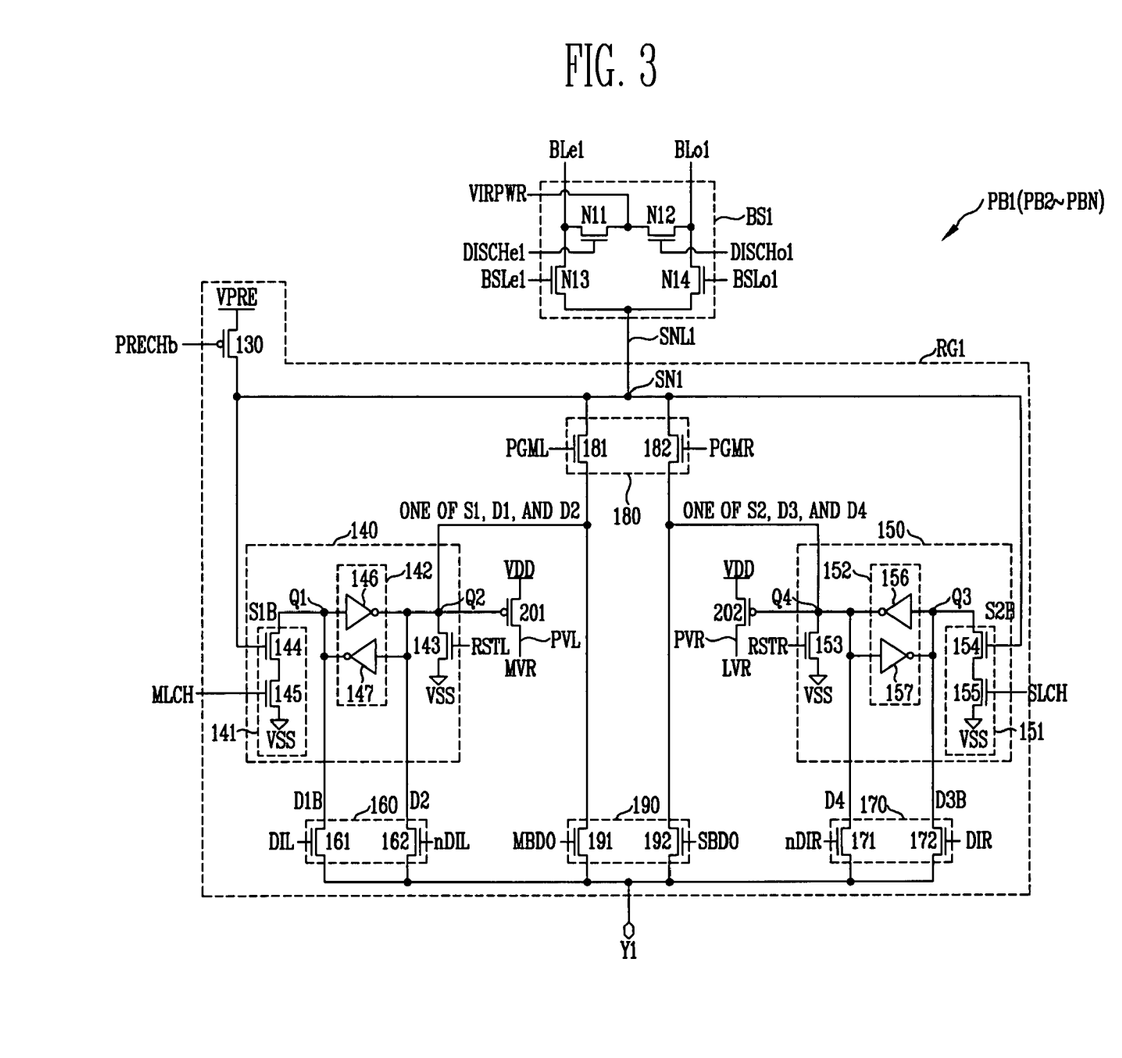
FIGS. 3 and 4 are circuit diagrams of a page buffer shown in FIG. 2.
Figure 4:
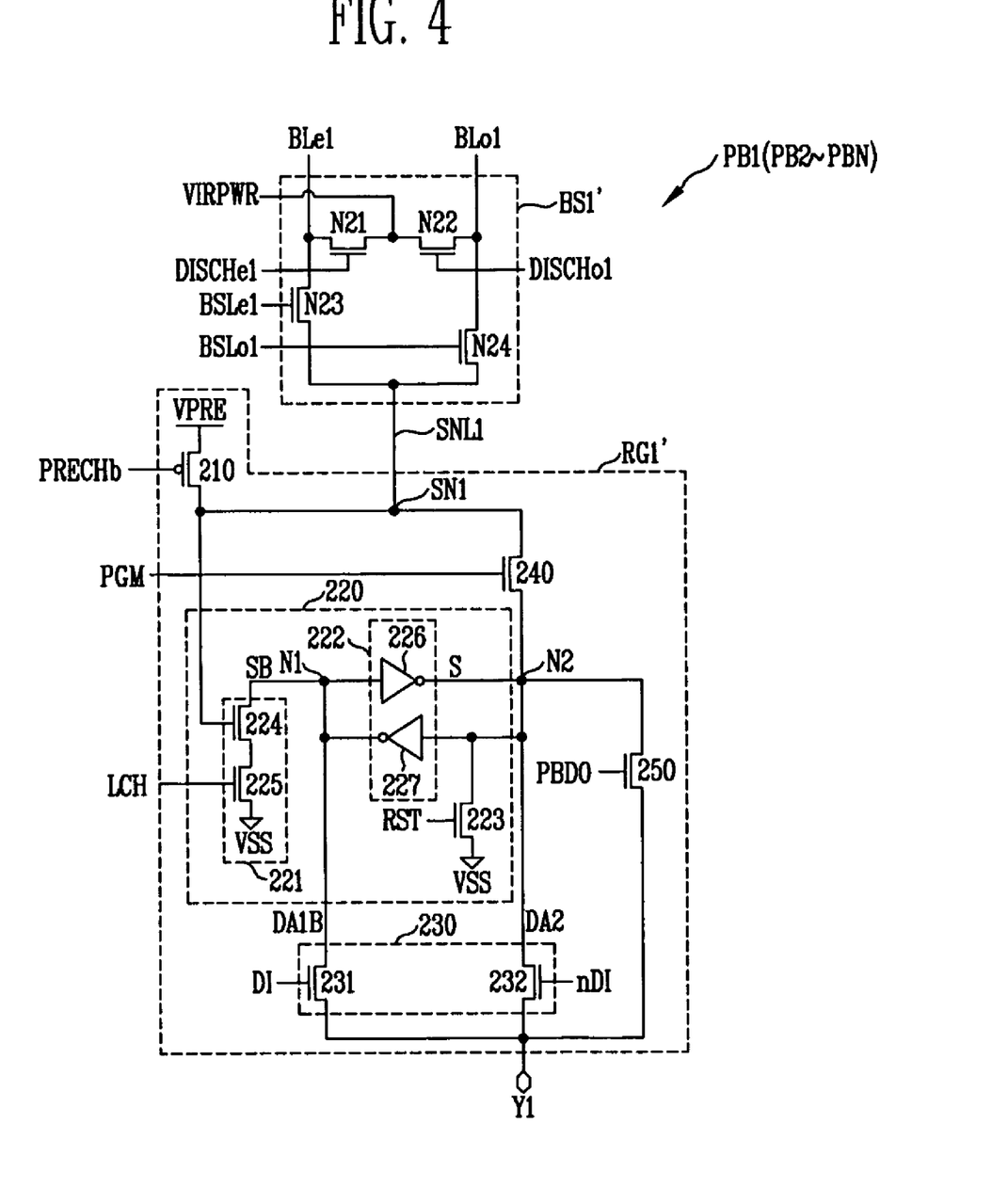

FIG. 3 is a detailed circuit diagram of the page buffers PB1 when each of the page buffers PB1 to PBN is designed according to the dual latch type. FIG. 4 is a detailed circuit diagram of the page buffers PB1 when each of the page buffers PB1 to PBN is designed according to the single latch type. The construction and operation of each of the page buffers PB1 to PBN will be described in detail below with reference to FIG. 3. The page buffers PB1 to PBN have substantially the same constructions and operations and only the page buffer PB1 will be described as an example.

The page buffer PB1 includes a bit line selection circuit BS1 and a register circuit RG1. The bit line selection circuit BS1 includes NMOIS transistors N11 to N14. The NMOIS transistor N11 outputs a bit line control signal VIRPWR to the bit line BLe1 in response to a discharge signal DISCHe1. The NMOIS transistor N12 outputs the bit line control signal VIRPWR to the bit line BLo1 in response to a discharge signal DISCHo1. The NMOIS transistor N13 connects the bit line BLe1 to the sensing line SNL1 in response to a bit line selection signal BSLe1. The NMOIS transistor connects the bit line BLo1 to the sensing line SNL1 in response to a bit line selection signal BSLo1.

For example, during the read operation or the program operation of the flash memory device 100, when the bit line BLe1 is selected, the bit line selection signal BSLe1 and the discharge signal DISCHo1 may be enabled and the bit line selection signal BSLo1 and the discharge signal DISCHe1 may be disabled. The NMOIS transistor N13 is turned on in response to the bit line selection signal BSLe1 and accordingly connects the bit line BLe1 to the sensing line SNL1. Furthermore, the NMOIS transistor N14 is turned off in response to the bit line selection signal BSLo1 and accordingly separates the bit line BLo1 from the sensing line SNL1. The NMOIS transistor N11 is turned off in response to a discharge signal DISCHe1 and stops the output of the bit line control signal VIRPWR to the bit line BLe1. The NMOIS transistor N12 is turned on in response to, the discharge signal DISCHo1 and accordingly outputs the bit line control signal VIRPWR to the bit line BLo1. Consequently, when the bit line selection circuit BS1 selects the bit line BLe1, the bit line BLe1 is connected to the sensing line SNL1 and the bit line BLo1 is separated from the sensing line SNL1, so that it is precharged to a voltage of the bit line control signal VIRPWR. As a result, the bit line BLo1 is shielded.

The register circuit RG1 includes a precharge circuit 130, registers 140, 150, data input circuits 160, 170, a program control circuit 180, a data output circuit 190, and verification circuits 201, 202.

The precharge circuit 130 precharges the sensing line SNL1 to a precharge voltage VPRE through a sensing node SN1 in response to the precharge control signal PRECHb. For example, the precharge circuit 130 may be implemented using a PMOS transistor. Meanwhile, though not shown in FIG. 3 in detail, the precharge control signal PRECHb may include two or more precharge signals PRECHb', PRECHb'.

In this case, the plurality of page buffers PB1 to PBN can be divided into two or more groups. For example, the page buffers PB1, PB3, PB5, . . . , PB(N-1) may form one group and the page buffers PB2, PB4, PB6, . . . , PBN may form another group. The precharge signals PRECHb', PRECHb" are respectively disabled at different points of time. For example, the precharge signal PRECHb' may be first disabled and the precharge signal PRECHb" may be then disabled. In this case, the precharge circuit 130 of each of the page buffers PB1, PB3, PB5, PB(N-1) precharges each of the sensing lines SNL1, SNL3, SNL5, SNL(N-1) to the precharge voltage VPRE in response to the precharge signal PRECHb'. Furthermore, the precharge circuit 130 of each of the page buffers PB2, PB4, PB6, . . . , PBN precharges each of the sensing lines SNL2, SNL4, SNL6, . . . , SNLN to he precharge voltage VPRE in response to the precharge signal PRECHb".

The register 140 includes a sensing circuit 141, a latch circuit 142, and a latch reset circuit 143. The sensing circuit 141 senses a voltage of the sensing node SN1 to which the sensing line SNL1 is connected and generates sensing data S1B to a node Q1, in response to a latch control signal MLCH.

The sensing circuit 141 includes NMOIS transistors 144, 145. The NMOIS transistor 144 is turned on or off in response to a voltage of the sensing node SN1, and the NMOIS transistor 145 is turned on or off in response to the latch control signal MLCH. When the NMOIS transistors 144, 145 are all turned on, the sensing data S1B of logic "0" are generated to the node Q1.

The latch circuit 142 includes inverters 146, 147 connected to the nodes Q1, Q2. The latch circuit 142 latches the sensing data S1B received from the node Q1 and outputs inverted sensing data S1 to a node Q2. The latch circuit 142 also latches input data D1B received through the node Q1 and outputs inverted input data D1 to the node Q2. Furthermore, the latch circuit 142 latches input data D2 received through the node Q2 and outputs inverted input data D2B to the node Q1.

The latch reset circuit 143 resets the latch circuit 142 in response to a reset control signal RSTL. For example, the latch reset circuit 143 may be implemented using a NMOIS transistor. In this case, the latch reset circuit 143 discharges the node Q2 to a ground voltage VSS when the reset control signal RSTL is enabled. As a result, the latch circuit 142 is reset.

The register 150 includes a sensing circuit 151, a latch circuit 152, and a latch reset circuit 153. The sensing circuit 151 includes NMOIS transistors 154, 155. The latch circuit 152 includes inverters 156, 157 connected between nodes Q3, Q4. The construction and operation of the register 150 are the same as those of the register 150, and description thereof will be omitted for simplicity.

The data input circuit 160 includes NMOIS transistors 161, 162. The NMOIS transistor 161 is connected between the node Q1 and a data I/O node Y1 and is turned on or off in response to an input control signal DIL. When being turned on, the NMOIS transistor 161 outputs the input data D1B, which are received through the data I/O node Y1, to the node Q1. The NMOIS transistor 162 is connected between the node Q2 and the data I/O node Y1 and is turned on or off in response to an input control signal NDIL. When being turned on, the NMOIS transistor N72 outputs the input data D2, which are received through the data I/O node Y1, to the node Q2.

The data input circuit 170 includes NMOIS transistors 171, 172. The NMOIS transistor 171 is connected between a node Q3 and the data I/O node Y1 and is turned on or off in response to an input control signal DIR. The NMOIS transistor 171 is turned on to output the input data D3B, which are received from the data I/O node Y1, to the node Q3. The NMOIS transistor 172 is connected between the node Q4 and the data I/O node Y1 and is turned on or off in response to an input control signal NDIR. The NMOIS transistor 172 is turned on to output the input data D4, which are received from the data I/O node Y1, to a node Q4.

The program control circuit 180 includes NMOIS transistors 181, 182. The NMOIS transistor 181 is connected between a sensing node SN1 and the node Q2 and is turned on or off in response to a program control signal PGML. The NMOIS transistor 181 is turned on to output the sensing data S1 or the input data D1 or D2, which are received from the node Q2, to the sensing node SN1. The NMOIS transistor 182 is connected between the sensing node SN1 and the node Q4 and is turned on or off in response to a program control signal PGMR. The NMOIS transistor 182 is turned on to output the sensing data S2 or the input data D3 or D4, which are received from the node Q4, to the sensing node SN1.

The data output circuit 190 includes NMOIS transistors 191, 192. The NMOIS transistor 191 is connected between the node Q2 and the data I/O node Y1 and is turned on or off in response to an output control signal MBDO. The NMOIS transistor 191 is turned on to output the sensing data S1, which are received from the node Q2, to the data I/O node Y1. Furthermore, the NMOIS transistor 192 is connected between the node Q4 and the data I/O node Y1 and is turned on or off in response to an output control signal SBDO. The NMOIS transistor 192 is turned on to output the sensing data S2, which are received from the node Q4, to the data I/O node Y1.

The verification circuit 201 outputs a verify signal MVR to a verify line PVL in response to the sensing data S1 received from the latch circuit 142 through the node Q2. For example, the verification circuit 201 may be implemented using a PMOS transistor. In this case, when the sensing data S1 are "0", the verification circuit 201 supplies an internal voltage VCC to the verify line PVL. As a result, the verify signal MVR of logic "1" is generated to the verify line PVL. In contrast, when the sensing data S1 are "1", the verification circuit 201 stops the supply of the internal voltage VCC to the verify line PVL. Though not shown in FIG. 2, when the verification circuit 201 does not supply the internal voltage VCC, the verify line PVL is discharged to the ground voltage VSS. Accordingly, the verify signal MVR of logic "0" is generated to the verify line PVL.

The verification circuit 202 outputs a verify signal LVR to a verify line PVR in response to the sensing data S2 received from the latch circuit 152 through the node Q4. For example, the verification circuit 202 may be implemented using a PMOS transistor. The operation of the verification circuit 202 is similar to that of the verification circuit 201, and description thereof will be omitted for simplicity The construction and operation of each of the page buffers PB1 to PBN when each of the page buffers PB1 to PBN is designed according to the single latch type will be described in detail with reference to FIG. 4. The page buffers PB1 to PBN have substantially the same constructions and operations and only the page buffer PB1 will be described as an example.

The page buffer PB1 includes a bit line selection circuit BS1' and a register circuit RG1'. The bit line selection circuit BS1' includes NMOIS transistors N21 to N24. The operations of the NMOIS transistors N21 to N24 are the same as those of the NMOIS transistors N11 to N14, and description thereof will be omitted for simplicity. The register circuit RG1' includes a precharge circuit 210, a register 220, a data input circuit 230, a program control circuit 240, and a data output circuit 250.

The precharge circuit 210 precharges a sensing line SNL1 to a precharge voltage VPRE through the sensing node SN1 in response to a precharge control signal PRECHb. For example, the precharge circuit 210 may be implemented using a PMOS transistor.

The register 220 includes a sensing circuit 221, a latch circuit 222, and a latch reset circuit 223. The sensing circuit 221 senses a voltage of the sensing node SN1 connected to the sensing line SNL1 and generates sensing data SB to the node N1, in response to a latch control signal LCH. The sensing circuit 221 includes NMOIS transistors 224, 225. The NMOIS transistor 224 is turned on or off in response to a voltage of the sensing node SN1 and the NMOIS transistor 225 is turned on or off in response to the latch control signal LCH. When the NMOIS transistors 224, 225 are all turned on, the sensing data SB of logic "0" are generated to the node N1. The latch circuit 222 includes inverters 226, 227 connected to nodes N1, N2. The latch circuit 222 latches the sensing data SB received from the node N1 and outputs inverted sensing data S to the node N2. Furthermore, the latch circuit 222 latches input data DA1B received through the node N1 and outputs inverted input data DA1 to the node N2. In addition, the latch circuit 222 latches input data DA2 received through the node N2 and outputs inverted input data DA2B to the node N1. The latch reset circuit 223 resets the latch circuit 222 in response to a reset control signal RST. For example, the latch reset circuit 223 may be implemented using a NMOIS transistor. In this case, the latch reset circuit 223 discharges the node N2 to the ground voltage VSS when the reset control signal RST is enabled. As a result, the latch circuit 222 is reset.

The data input circuit 230 includes NMOIS transistors 231, 232. The NMOIS transistor 231 is connected between the node N1 and the data I/O node Y1 and is turned on or off in response to an input control signal DI. The NMOIS transistor 231 is turned on to output input data DA1B. which are received from the data I/O node Y1, to the node N1. The NMOIS transistor 232 is connected between the node N2 and the data I/O node Y1 and is turned on or off in response to input control signal nDI. The NMOIS transistor 232 is turned on to output input data DA2, which are received from the data I/O node Y1, to the node N2.

The program control circuit 240 outputs the input data DA1 or DA2, which are received from the node N2, to the sensing node SN1 in response to the program control signal PGM. The program control circuit 240 may be implemented using a NMOIS transistor. The data output circuit 250 outputs the sensing data S, which are received from the node N2, to the data I/O node Y1 in response to an output control signal PBDO. The data output circuit 250 may be implemented using a NMOIS transistor.

Figure 5:
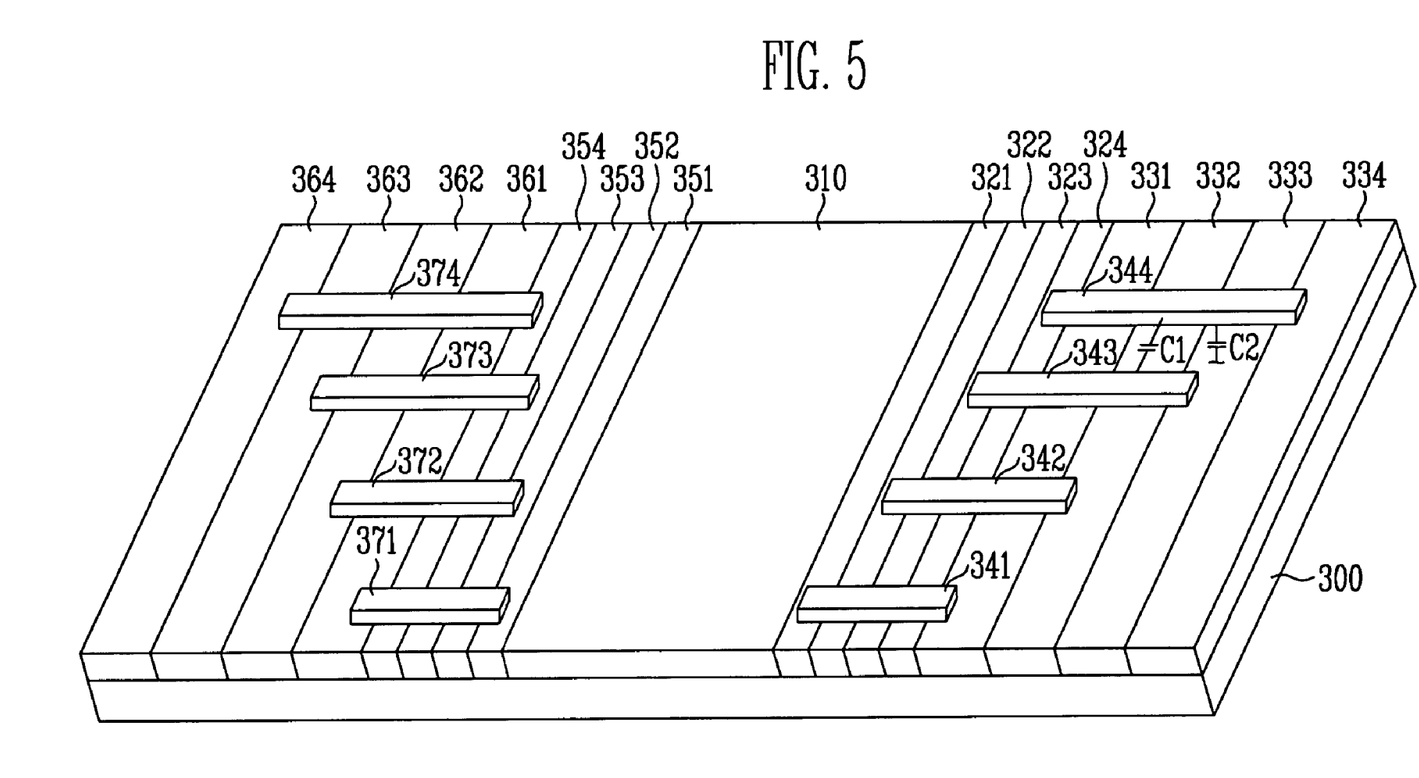
FIG. 5 is a perspective view conceptually showing a semiconductor substrate in which a part of page buffers and a memory cell array shown in FIG. 2 are formed.

FIG. 5 is a perspective view conceptually showing a semiconductor substrate in which a part of the page buffers and the memory cell array shown in FIG. 2 are formed. It is to be understood that in order to simplify the drawing, detailed constituent elements of each of the page buffers and the memory cell array are omitted and only regions in which respective elements are formed are shown as an example in FIG. 5.

A memory cell array pattern 310, bit line selection circuit patterns 321 to 324, 351 to 354, and register circuit patterns 331 to 334, 361 to 364 are formed on a semiconductor substrate 300. The bit line selection circuit patterns 321 to 324 are consecutively arranged on one side of the memory cell array pattern 310 and the register circuits 331 to 334 are consecutively arranged on one side of the bit line selection circuit pattern 324. Furthermore, to form electrical paths between the bit line selection circuit patterns 321 to 324 and the register circuit patterns 331 to 334, the sensing line patterns 341 to 344 are formed on the bit line selection circuit patterns 321 to 324 and the register circuit patterns 331 to 334. For example, the sensing line pattern 341 may form an electrical path between the bit line selection circuit pattern 321 and the register circuit pattern 331.

The bit line selection circuit patterns 351 to 354 are consecutively arranged on the other side of the memory cell array pattern 310 in a similar way to the bit line selection circuit patterns 321 to 324. The register circuit patterns 361 to 364 are consecutively arranged on one side of the bit line selection circuit pattern 354. Furthermore, to form electrical paths between the bit line selection circuit patterns 351 to 354 and the register circuit patterns 361 to 364, the sensing line patterns 371 to 374 are formed on the bit line selection circuit patterns 351 to 354 and the register circuit patterns 361 to 364.

Meanwhile, a parasitic capacitor C1 exists between adjacent sensing line patterns 341 to 344 and 371 to 374, only one of which (between sensing line patterns 344 and 343) is shown in FIG. 5. Furthermore, a parasitic capacitor C2 exists between the sensing line patterns 341 to 344 and 371 to 374 and lower patterns (i.e., a bit line selection circuit pattern and a register circuit pattern), only one of which (between sensing pattern 344 and register circuit pattern 33) is shown in FIG. 5. In this case, the parasitic capacitors C1, C2 may affect a voltage of read data, which are transmitted through the sensing lines SNL1 to SNLN during a read operation of the flash memory device 100. For example, an example in which a logic value of read data transmitted through the sensing line SNL2 is "1" and logic values of read data respectively transmitted through the sensing lines SNL1, SNL3 are "0" may be considered. In this case, the voltage of the read data transmitted through the sensing line SNL2 is reduced a voltage ΔV due to the coupling capacitance of the parasitic capacitors C1, C2.

For example, assuming that the precharge voltage VPRE of the sensing line SNL2 is the internal voltage VCC, the voltage ΔV can be expressed in the following equation.

$$\Delta V = (C_P / C_G + C_P) \times VCC \quad \text{[Equation 1]}$$

(where $C_p$ is capacitance of C1 and $C_G$ is capacitance of C2)

Figure 6:
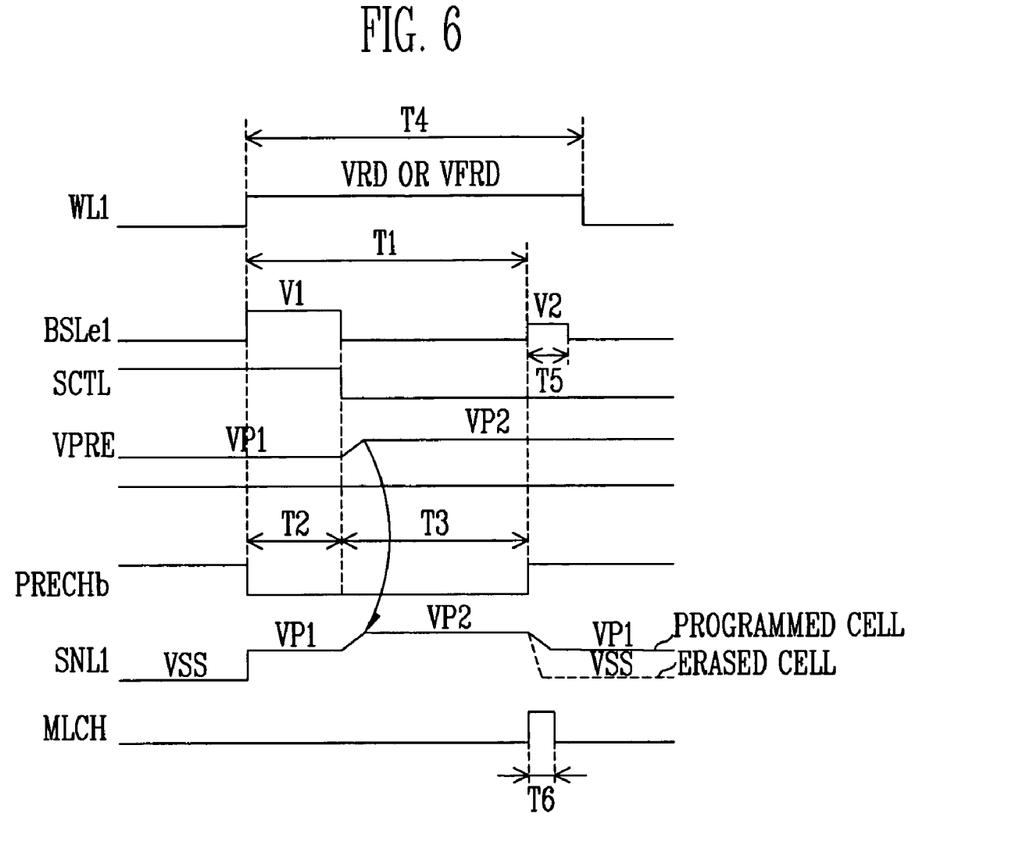
FIG. 6 is a timing diagram illustrating signals related to the read operation of the flash memory device shown in FIG. 2.

The normal or verification read operation process of the flash memory device 100 will be described in detail with reference to FIG. 6. FIG. 6 is a timing diagram illustrating signals related to the read operation of the flash memory device shown in FIG. 2. In general, the read operation of the flash memory device 100 is executed on one-page basis (one of PG1 to PGK) of the memory cell array 110. In the present embodiment, however, a process in which a word line WL1 and a bit line BLe1 are selected and data are read from a memory cell Me1 connected to the word line WL1 and the bit line BLe1 will be described as an example for convenience of description. Furthermore, in the present embodiment, the operation of the page buffer PB1 shown in FIG. 3 will be described as an example.

The first and second voltage generators 121, 122 of the precharge voltage generator 120 first generate the first and second voltages VP1, VP2, respectively. At this time, the first voltage generator 121 generates the first voltage VP1 as an internal voltage (VCC) level and the second voltage generator generates the second voltage VP2 as a voltage (VCC+ΔV) level. The voltage ΔV is the same as that represented by Equation 1.

Thereafter, during a time T1, the precharge control signal PRECHb is disabled. When the precharge control signal PRECHb is disabled, the selection control signal SCTL and the bit line selection signal BSLe1 are enabled during the time T2. Though not shown in FIG. 6, while the bit line selection signal BSLe1 is enabled, the bit line selection signal BSLo1 and the discharge signal DISCHe1 are disabled and the discharge signal DISCHo1 is enabled.

The voltage selector 123 of the precharge voltage generator 120 selects the first voltage VP1 and outputs the first voltage VP1 as the precharge voltage VPRE, in response to the selection control signal SCTL during the time T2. The precharge circuit 130 precharges the sensing line SNL1 to the precharge voltage VPRE (i.e., the first voltage VP1) through the sensing node SN1 in response to the precharge control signal PRECHb during the time T2. At this time, the bit line selection circuit BS1 connects the bit line BLe1 to the sensing line SNL1 and separates the bit line BLo1 from the sensing line SNL1, in response to the bit line selection signals BSLe1, BSLo1. Furthermore, the bit line selection circuit BS1 discharges the bit line BLo1 to a voltage of the bit line control signal VIRPWR (i.e., the ground voltage VSS) in response to the discharge signals DISCHe1, DISCHo1, thereby shielding the bit line BLo1. Consequently, during the time T2, the bit line BLe1 and the sensing line SNL1 are precharged to the precharge voltage VPRE.

After the time T2, the selection control signal SCTL is disabled. During a time T3, the bit line selection signal BSLe1 is disabled. The voltage selector 123 selects the second voltage VP2 and outputs the second voltage VP2 as the precharge voltage VPRE, in response to the selection control signal SCTL. The bit line selection circuit BS1 separates the bit line BLe1 from the sensing line SNL1 during the time T3 in response to the bit line selection signal BSLe1. During the time T3, the precharge control signal PRECHb keeps disabled. The precharge circuit 130 precharges the sensing line SNL1 to the precharge voltage VPRE (i.e., the second voltage VP2) through the sensing node SN1 during the time T3 in response to the precharge control signal PRECHB.

Meanwhile, during a time T4, the read voltage VRD or the verification read voltage VFRD is supplied to the word line WL1. The verification read voltage VFRD may be higher than the read voltage VRD. For example, in the case of the normal read operation of the flash memory device 100, the word line WL1 may be supplied with the read voltage VRD. In the case of the verification read operation of the flash memory device 100, the word line WL1 may be supplied with the verification read voltage VFRD. After the time T1, the precharge control signal PRECHb is enabled. As a result, the precharge circuit 130 stops the precharge operation of the sensing line SNL1 in response to the precharge control signal PRECHb.

Thereafter, during a time T5, the bit line selection signal BSLe1 is enabled. The bit line selection circuit BS1 connects the bit line BLe1 to the sensing line SNL1 during the time T5 in response to the bit line selection signal BSLe1. For example, in the case where the memory cell Me11 is an erased cell, the voltage VP2 of the sensing line SNL1 gradually decreases and then becomes the ground voltage VSS. In the case where the memory cell Me11 is a programmed cell, the voltage VP2 of the sensing line SNL1 is decreased as much as the voltage ΔV by means of coupling capacitance of the sensing line SNL1.

Thereafter, during a time T6, the latch control signal MLCH is enabled. The sensing circuit 141 of the register 140 senses a voltage of the sensing node SN1 in response to the latch control signal MLCH. At this time, the voltage of the sensing node SN1 is decided by a voltage of the sensing line SNL1. In the case where the memory cell Me11 is an erased cell, the NMOIS transistor 144 of the sensing circuit 141 is turned off. Accordingly, the latch circuit 142 of the register 140 stays initialized. Meanwhile, in the case where the memory cell Me11 is a programmed cell, the NMOIS transistor 144 is turned on since the voltage of the sensing line SNL1 is kept to the voltage VP1. As a result, the sensing circuit 141 discharges the node Q1 to the ground voltage VSS and generates the sensing data S1B of logic "0" to the node Q1. The latch circuit 142 latches and stores the sensing data S1B. Furthermore, the latch circuit 142 inverts the sensing data S1B and outputs the sensing data S1 to the node Q2. Though not shown in FIG. 6, the output control signal MBDO is enabled and the output control signal SBDO is disabled. The NMOIS transistor 191 of the data output circuit 190 outputs the sensing data S1, which are received from the node Q2, to the data I/O node Y1 in response to the output control signal MBDO.

As described above, in the flash memory device 100, during the read operation, the precharge voltage generator 120 increases the precharge voltage VPRE and generates an increased precharge voltage VPRE as much as a voltage of the sensing line SNL1, which is decreased by coupling capacitance of the sensing line SNL1. As a result, since the sensing line SNL1 is previously precharged to the increased voltage VP2, a voltage of the sensing line SNL1 can be kept to an initial precharge voltage VPRE (i.e., VP1) although the voltage of the sensing line SNL1 decreases subsequently. Accordingly, during the read operation of the flash memory device 100, an interference phenomenon between the sensing lines can be reduced and failure in the verification read operation or the normal read operation can be reduced.

As described above, in accordance with the flash memory device and the read operation method thereof according to the present invention, during the read operation or normal read operation for program verification, a precharge voltage for the sensing node is selectively changed. Accordingly, signal interference between sensing lines can be reduced and failure in the read operation can be reduced.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A flash memory device comprising:
  a memory cell away including a plurality of memory cells sharing a plurality of word lines and a plurality of bit lines;
  a precharge voltage generator, including a first voltage generator for generating a first voltage and a second voltage generator for generating a second voltage, for outputting one of the first and second voltages as a precharge voltage in response to a selection control signal; and
  a plurality of page buffers, each page buffer being connected to a pair of the plurality of bit lines, for precharging sensing lines to the precharge voltage in response to a precharge control signal, wherein during a verification read operation or normal read operation of the flash memory device, each of the plurality of page buffers sense read data transferred from one of the plurality of memory cells to one of the sensing lines through the at least one pair of bit lines.

2. The flash memory device of claim 1, wherein the second voltage is higher than the first voltage.

3. The flash memory device of claim 2, wherein a difference between the first voltage and the second voltage is determined from the coupling capacitance of one of the sensing lines.

4. The flash memory device of claim 1, wherein the precharge voltage generator comprises a voltage selector for selecting one of the first voltage and the second voltage and outputting a selected voltage as the precharge voltage, in response to the selection control signal.

5. The flash memory device of claim 4, wherein when the precharge control signal is disabled, each of the plurality of page buffers precharges each of the sensing lines to the precharge voltage, the selection control signal is enabled during a part of the whole period in which the precharge control signal is disabled and is disabled during the remaining periods, and the voltage selector outputs the first voltage as the precharge voltage when the selection control signal is enabled, and outputs the second voltage as the precharge voltage when the selection control signal is disabled.

6. The flash memory device of claim 4, wherein the voltage selector comprises a multiplexer for selecting one of the first voltage and the second voltage in response to the selection control signal.

7. The flash memory device of claim 1, wherein each of the plurality of page buffers comprises:

a bit line selection circuit for selecting one of the at least one pair of bit lines and connecting a selected bit line to one of the sensing lines, in response to bit line selection signals and discharge signals; and a register circuit for precharging one of the sensing lines to the precharge voltage in response to the precharge control signal, and sensing the read data, which are received through one of the sensing lines, from one of the plurality of memory cells, which is connected to the selected bit line, and storing the sensed data during the verification read operation or normal read operation.

8. The flash memory device of claim 7, wherein the register circuit is a dual latch type, and the register circuit stores input data received through a data I/O node and outputs the stored input data to one of the sensing lines, during a program operation of the flash memory device.

9. The flash memory device of claim 8, wherein the register circuit comprises:

a precharge circuit for precharging one of the sensing lines to the precharge voltage in response to the precharge control signal;

a first register for storing the input data or sensing a voltage of one of the sensing lines in response to a first latch control signal, and storing first sensing data;

a first input control circuit for outputting the input data received from the data I/O node in the first register in response to first input control signals;

a second register for storing the input data, or sensing a voltage of one of the sensing lines and storing second sensing data, in response to a second latch control signal;

a second data input circuit for outputting the input data received from the data I/O node in the second register in response to second input control signals;

a program control circuit for outputting the first or second sensing data, which are received from the first or second register, or the input data to one of the sensing lines in response to a first or second program control signal; and a data output circuit for outputting the first or second sensing data, which are received from the first or second register, to the data I/O node in response to a first or second output control signal.

10. The flash memory device of claim 7, wherein the register circuit is a single latch type, and the register circuit stores input data received through a data I/O node and outputs the stored input data to one of the sensing lines, during a program operation of the flash memory device.

11. The flash memory device of claim 10, wherein the register circuit comprises:

a precharge circuit for precharging one of the sensing lines to the precharge voltage in response to the precharge control signal;

a register for storing the input data, or sensing a voltage of one of the sensing lines and storing sensing data, in response to a latch control signal;

a data input circuit for outputting the input data received from the data I/O node in the register in response to input control signals;

a program control circuit for outputting the input data, which are received from the register, to one of the sensing lines in response to a program control signal; and a data output circuit for outputting the sensing data, which are received from the register, to the data I/O node in response to an output control signal.

12. The flash memory device of claim 1, wherein the precharge control signal comprises two or more precharge signals that are disabled at different points of time, the plurality of page buffers are divided into two or more groups, page buffers included in one of the two or more groups precharge a part of the sensing lines to the precharge voltage in response to one of the two or more precharge signals, and page buffers included in another of the two or more groups precharge the remaining sensing lines to the precharge voltage in response to another of the two or more precharge signals.

13. A read operation method of a flash memory device including a plurality of memory cells and at least one pair of bit lines, the method comprising the steps of:

generating a first voltage and a second voltage as a precharge voltage;

precharging at least one sensing line to one of the first and second voltages as the precharge voltage;

selecting one of a plurality of word lines and supplying the selected word line with a read voltage or a verification read voltage;

selecting one of the bit lines;

connecting the selected bit line to the at least one sensing line; and sensing read data, which have been transferred from a memory cell connected to the selected word line and the selected bit line, to the at least one sensing line and storing the sensed data in at least one register, in response to a latch control signal.

14. The read operation method of claim 13, further comprising the step of connecting the selected bit line to the sensing line during a first set time in response to the bit line selection signals and the discharge signals so that the selected bit line is precharged to the precharge voltage when at least one sensing line is precharged.

15. The read operation method of claim 13, further comprising the step of outputting the sensing data stored in the at least one register to the data I/O node in response to an output control signal.

16. The read operation method of claim 14, wherein the step of generating the precharge voltage comprises the steps of:

generating the first voltage;

generating the second voltage higher than the first voltage;

outputting the first voltage as the precharge voltage during the first set time in response to a selection control signal; and outputting the second voltage as the precharge voltage during a second set time in response to the selection control signal.

17. The read operation method of claim 16, wherein the precharging step comprises the steps of:

precharging the at least one sensing line to the first voltage during the first set time; and precharging the at least one sensing line to the second voltage during the second set time.

18. The read operation method of claim 16, wherein a difference between the first voltage and the second voltage is decided by coupling capacitance of the at least one sensing line.

* * * * *